United States Patent [19]
Pulyer et al.

[11] Patent Number: 5,572,132
[45] Date of Patent: Nov. 5, 1996

[54] MRI PROBE FOR EXTERNAL IMAGING

[76] Inventors: Yuly M. Pulyer, 350 Revere Beach Blvd., Revere, Mass. 02151; Samuel Patz, 32 Harrison St., Brookline, Mass. 02146

[21] Appl. No.: 515,483

[22] Filed: Aug. 15, 1995

[51] Int. Cl.$^6$ .................................................. G01V 3/00
[52] U.S. Cl. ..................... 324/318; 324/322; 128/653.2
[58] Field of Search .................................. 324/300, 307, 324/309, 310, 311, 312, 313, 314, 318, 319, 320, 322; 128/653.1, 653.2, 653.3

[56] References Cited

U.S. PATENT DOCUMENTS

| | | | |
|---|---|---|---|
| 4,350,955 | 9/1982 | Jackson et al. | 324/303 |
| 5,296,811 | 3/1994 | Ehnbolm et al. | 324/318 |
| 5,334,937 | 8/1994 | Peck et al. | 324/318 |
| 5,390,673 | 2/1995 | Kilkinis | 324/309 |
| 5,432,446 | 7/1995 | MacInnis et al. | 324/303 |
| 5,462,054 | 10/1995 | Rapoport et al. | 324/318 |

OTHER PUBLICATIONS

J. of Vascular and Interventional Radiology, 1993, 4:419–427.
AJR 1995, 164:1265–1270.
J. of Magnetic Resonance 41, 400–405 (1980).
J. of Magnetic Resonance 41, 406–410 (1980).
J. of Magnetic Resonance 41, 411–421 (1980).

*Primary Examiner*—Michael Tokar
*Attorney, Agent, or Firm*—George W. Neuner

[57] ABSTRACT

A magnetic resonance imaging (MRI) probe having an external background magnetic field $B_o$ is described. The probe has a primary magnet having a longitudinal axis and an external surface extending in the axial direction and a rf coil surrounding and proximal to the surface. The magnet provides a $B_o$ field having an external region of substantial homogeneity proximal to the surface. Preferably, the $B_o$ field is provided by two magnets spaced axially and in axial alignment and wherein said region of homogeneity intersects a plane located between the magnets and perpendicular to the axis. For MR imaging, surrounding the primary magnet are r-, z- and ø-gradient coils to provide spatial encoding fields.

12 Claims, 9 Drawing Sheets

FIG. 5d $B_z(\phi) = B_0 \cos\phi$
$0 \leq \phi \leq 360$

MRI PROBE FOR EXTERNAL IMAGING

BACKGROUND OF THE INVENTION

This invention relates to magnetic resonance imaging ("MRI") magnet and probe design for imaging a region external to probe for biomedical or industrial imaging applications. More specifically, a primary magnet provides a homogeneous field external to the surface of the magnet suitable for imaging. Preferably, the primary magnet is a cylindrical permanent magnet, but can be a symmetrical magnet having rectangular shape or having an outer surface defined by a surface of revolution. A MRI catheter containing such a magnet and a rf coil is particularly suited for endoscopical imaging of tissue of the artery wall, rectum, urinal tract, intestine, esophagus, nasal passages, vagina and other biomedical applications. It also is suitable for geophysical, oceanological and industrial applications involving MRI imaging or spectroscopy of regions external to the magnet.

Solenoidal MRI magnets (superconductive, resistive) as well as iron core C and E shape electromagnets or permanent magnets are known for imaging of the whole body and its extremities. However, such whole body MRI magnets are very expensive and bulky. They are not particularly portable and, thus, are not generally widely suitable for endoscopical imaging of various parts of body.

Typically, MRI magnets are designed to provide a homogeneous magnetic field in an internal region within the magnet, i.e., in a large central bore of a solenoid or the air gap between the magnetic poles. A patient or object to be imaged is usually positioned in the homogeneous field region located in the central air gap for imaging. In addition to the main or primary magnet that provides the background magnetic field $B_o$, the MRI system typically has gradient and rf coils which are used for spatial encoding and exciting the nuclei for imaging. These gradient field and rf coils are typically located external to the patient inside the primary magnet surrounding the central air gap.

To provide a higher resolution of artery wall images, Kandarpa et al. investigated the feasibility of a miniature endoluminal magnetic resonance (MR) detection coil (i.e., rf receiving coil) for imaging mural and perimural anatomy of small tubular structures. J. Vascular and Interventional Radiology 1993, 4:419-27. The authors concluded that, with further development, such a detection coil may be useful for studying atherosclerosis and for providing imaging guidance during endoluminal MR interventions. In vivo tracking and accurate placement of catheters equipped with miniature rf coils is described in AJR 1995, 164:1265-70. However, use of catheters equipped with miniature rf coils as described in these publications still requires positioning the patient in conventional large specialized MRI magnets. This environment can result in deficient images because the various orientations of the rf coil, e.g., in an artery, will not be positioned always colinearly with the rf excitation field. Also, very large gradients are needed with external ∅ gradients to get sufficient spatial resolution.

Contrast angiography is the conventional technique used for vascular imaging. However, this technique produces a lumenogram (or two dimensional projection) rather than a true three dimensional image. This technique requires exposure to ionized radiation. To address some of the limitations of angiography, ultrasound has also been developed. Intravascular ultrasound has been successful in defining the location of calcifications and directing atherectomy, however, it has not been clinically useful in tissue characterization of atherosclerotic plaque and arterial obstruction. Angioscopy has provided valuable contributions to understanding unstable angina but it is limited by its ability to view only the surface of an atheroma in a bloodless field. External magnetic resonance angiography has not achieved sufficient resolution to be useful for planning or assessment of vascular interventions.

U.S. Pat. No. 4,350,955 describes means for producing a homogeneous magnetic field remote from the source of the field, wherein two equal field sources are arranged axially so that their fields oppose, producing a region near the plane perpendicular to the axis midway between the sources where the radial component of the field goes through a maximum. A region of relative radial field $B_r$ homogeneity may be found near the maximum. See also, *J. Mag. Resonance* 1980, 41:400-5; *J. Mag. Resonance* 1980, 41:406-10; *J. Mag. Resonance* 1980, 41:411-21. Thus, two coils having opposing polarity are positioned axially in a spaced relationship to produce a relatively homogeneous toroidal magnet field region in a plane between the magnets and perpendicular to the axis of cylindrical symmetry.

Thus, it is desirable to have new and better devices and techniques for biomedical MRI applications such as intravascular imaging and tissue characterization. Such devices and techniques could be applied to a wide variety of imaging and tissue characterization uses such as, for example, transurethral or transrectal imaging of the prostrate, imaging of the esophagus, colon, and small intestine, etc. The design of a small probe to image a target volume external to its surface can enable high resolution images in the imaging volume.

SUMMARY OF THE INVENTION

The present invention provides a MRI or nuclear magnetic resonance ("NMR") spectroscopic probe having an external background magnetic field $B_o$. The probe comprises (i) a primary magnet having a longitudinal axis and an external surface extending in the axial direction and (ii) a rf coil surrounding and proximal to said surface. The primary magnet is structured and configured to provide a symmetrical, preferably cylindrically shaped, homogeneous field region external to the surface of the magnet. The rf coil receives NMR signals from excited nuclei. For imaging, one or more gradient coils are provided to spatially encode the nuclear spins of nuclei excited by an rf coil, which may be the same coil used for receiving NMR signals or another rf coil.

A MRI probe, in accord with one embodiment of the present invention, comprises a symmetrical primary permanent magnet, and a gradient coil and a rf coil surrounding the axial aligned surface of the magnet to provide a compact MRI probe. In a preferred embodiment, a cylindrical permanent magnet provides a background magnetic field $B_o$ having an external region of axial direction ("z-direction") field homogeneity in proximity to the magnet surface. The gradient coil or coils provide spatial encoding fields for imaging by providing z-direction fields that vary radially, angularly and axially to be determined in accord with a cylindrical coordinate system. The rf coil receives the NMR signals which can be used for image reconstruction. The field to excite the nuclear spins to obtain the NMR signals can be provided by the same rf coil used to receive the NMR signals or by a second rf coil.

For biomedical applications, preferably, a miniature MRI probe is provided in a traditional type catheter, such as used for other medical purposes, e.g., angiography. When inserted in vivo into an artery or body cavity in close proximity to the wall tissue, this probe can provide high resolution images of the wall tissue.

In a preferred embodiment of the present invention, a permanent magnet in the form of a cylinder is made from high energy rare earth ferrite materials such as, for example, neodymium or samarian cobalt, which can provide a desirable high strength background $B_o$ field. Preferably, pole caps made of a soft ferromagnetic material such as iron are also used. The pole caps are provided to maximize and enhance the region of homogeneity of the external cylindrically symmetric $B_o$ field provided by the magnet.

In another embodiment of the invention, a ø-gradient coil system is provided for spatial encoding in cylindrical coordinates to provide a z-directed field gradient $B_z$ that varies periodically with the angular coordinate ø over the range 0° to 360°. Such a ø-gradient coil is preferred in view of the cylindrical symmetry of the external background field of the primary magnet.

For purposes of the present invention, the terms "homogeneous" and "substantial homogeneity" mean that the magnetic field in the target or imaging volume does not vary significantly enough to prevent the obtaining of useful MR images or spectroscopy information.

Additional objects, advantages and features of the invention will become apparent from the following specification when taken with the accompanying drawings.

BRIEF DESCRIPTION OF THE DRAWINGS

FIG. 5b is a graph qualitatively illustrating the angular ø-gradient field around the cylindrical surface of a magnet system as provided by the gradient coil configuration illustrated in FIG. 5a.

FIG. 5d is a schematic illustrating a quasi-linear field region and a field region that causes aliasing in the image, which fields are generated by the ø-gradient coil of FIG. 5a.

DETAILED DESCRIPTION OF THE INVENTION

In accord with the present invention, a MRI probe comprises a primary symmetrical magnet and an rf coil surrounding the primary magnet, thereby providing an excitation and imaging volume external to the primary magnet. For imaging, gradient coils also are provided surrounding the primary magnet for spatial encoding of the nuclear spins for imaging. For NMR spectroscopy, such gradient coils can be used for shimming. For biomedical applications, the MRI probe is preferably enclosed in a catheter tip for insertion into the vascular system or into various body cavities. Electrical connections to the electromagnet coils are provided through the catheter tube, which protects the electrical connections from body fluids and insulates body tissue from electrical charges.

Figures 1A, 1C:
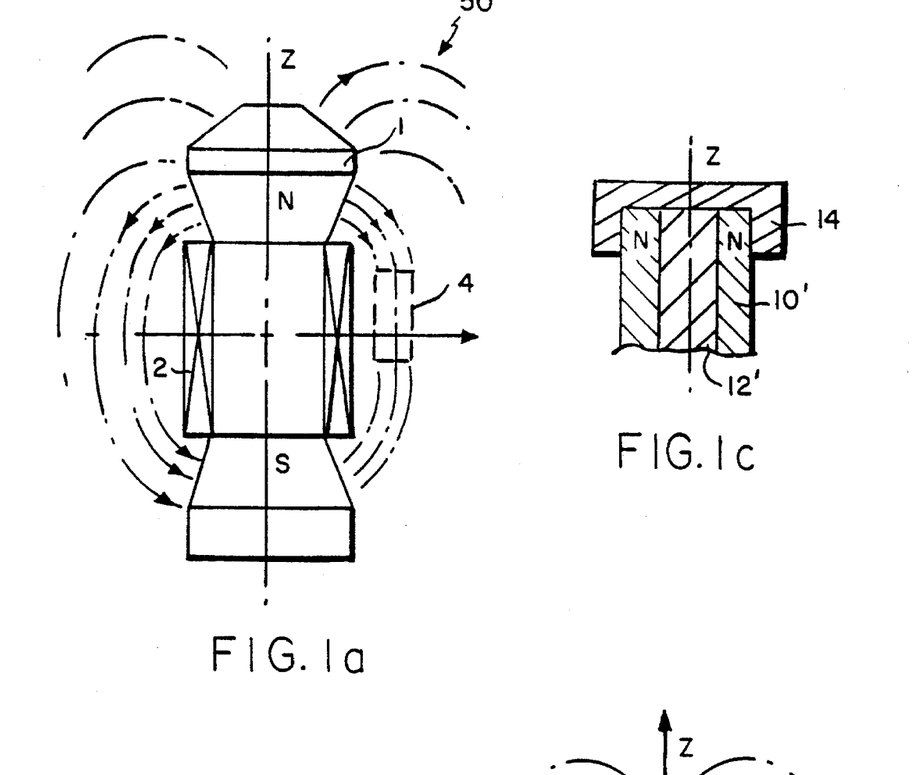
FIG. 1a is a front elevational view of a MRI probe in accord with the present invention illustrating a cylindrical primary magnet and the coaxial position of the gradient coils and the rf coil around the surface of the primary magnet.
FIG. 1c is a partial cross-sectional view illustrating an alternative configuration for a pole cap.

Referring to the drawings, in accord with one embodiment of the present invention, a MRI magnet system 50 consists of permanent magnet block 1 to obtain an axial ("z-") directed magnetic field in the target region in proximity to the magnet surface (FIG. 1a), the field being symmetrical in ø, i.e., constant with angle of rotation. The field lines are illustrated by dashed lines with flux direction indicated by arrows. The magnet system 50 includes a package of cylindrical coils 2 surrounding the cylindrical surface of the permanent magnet. The coils 2 include r-, ø- and z-gradient coils, each providing an approximately linear or periodic gradient field $B_z$ (axial field component) required for spatial encoding of the NMR signals (nuclear spins) from a sample in the external imaging volume 4 as well as a quadrature rf coil which provides an external circularly polarized excitation field in the imaging volume and/or receives the NMR signals from the excited nuclei in the sample. The magnet can be optimally shaped by an appropriate surface of revolution designed to increase field homogeneity in the target imaging volume 4. Shimming coils can also be used to increase homogeneity in the target imaging volume as is well known in the art.

Figure 4:
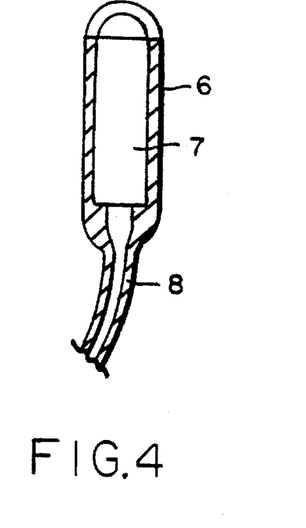
FIG. 4 illustrates a MRI probe encapsulated in a catheter tip with a flexible tube to provide mechanical and electrical connections (not shown) in accord with the present invention.

MRI probes in accord with the present invention are preferably configured for use in tubular spaces for imaging or spectroscopy of regions external to the probe. For endoscopic applications, the probe is preferably encapsulated and electrical connections are made through a cable (not shown) by conventional techniques well known to those skilled in the art. For biomedical applications, the MRI probe 7 is conveniently encapsulated in the tip 6 of a catheter (FIG. 4) with the catheter tubing 8 containing the cable or wiring for electrical connections to the coils (not shown). The size of the probe is made for convenient insertion into the region to be imaged.

Figure 1B:
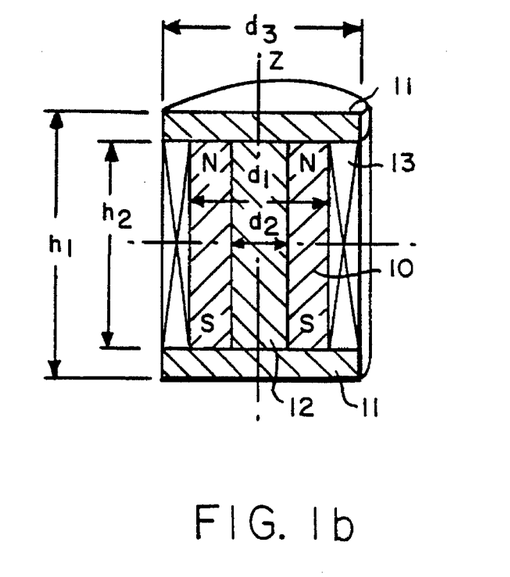
FIG. 1b is an elevational, cross-sectional view of an alternative MRI probe in accord with the present invention illustrating a cylindrical magnet having pole caps.

The primary or $B_o$ magnet can also be made of an annular permanent magnet block 10 (FIG. 1b) having a central iron core 12 and two iron pole end caps 11. On the exterior cylindrical surface of the permanent magnet are located gradient and rf coils 13. The dimensions of the magnets including the diameter d, the height of the permanent magnet $h_2$, and the total height of the magnet with pole caps $h_1$ are designed to provide a substantially homogeneous $B_o$ magnetic field in an external imaging region. The magnet pole end caps can be configured in a variety of shapes as desired to enhance the homogeneity of the $B_o$ field produced by the primary magnet or magnets. See FIG. 1c where the pole cap extends along the cylindrical surface of the annular permanent magnet 10'. The pole cap can also have complex shapes like the complex shaped end portions of the permanent magnet block 1 in FIG. 1a to make manufacturing of such magnets easier and more economical. The permanent magnet block can thus be configured conveniently and economically as a right circular cylinder.

Figure 1D:
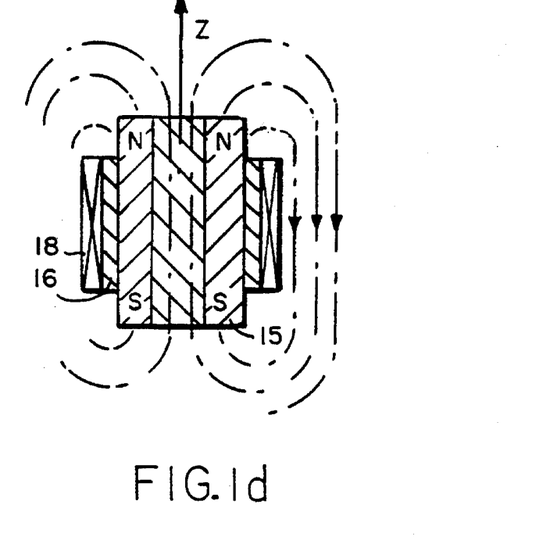
FIG. 1d is an elevational, cross-sectional view of an alternative MRI probe in accord with the present invention illustrating a cylindrical flow through magnet with shim coils, gradient coils and a rf coil.

In another embodiment, an annular permanent magnet block 15 (FIG. 1d) is provided with one or more shimming coils 16 to adjust the homogeneity of the background field in the imaging volume. Gradient and rf coils 18 are also provided, as in previous embodiments. Gradient coils for imaging can also be positioned externally of the sample or patient in which MRI probes in accord with the present invention are used.

In applications where the MRI probe is used in conduits having fluid flow and it is desirable to maintain flow, the probe can be structured and sized to be smaller than the diameter of the conduit, thereby permitting flow around the magnet probe. Alternatively, the MRI probe can be designed with a passageway through the probe for flow. This alternative will permit the probe to be closer to the conduit wall. Designs permitting fluid flow around or through the probe are desirable when used for vascular applications such as in an artery.

Figure 2A:
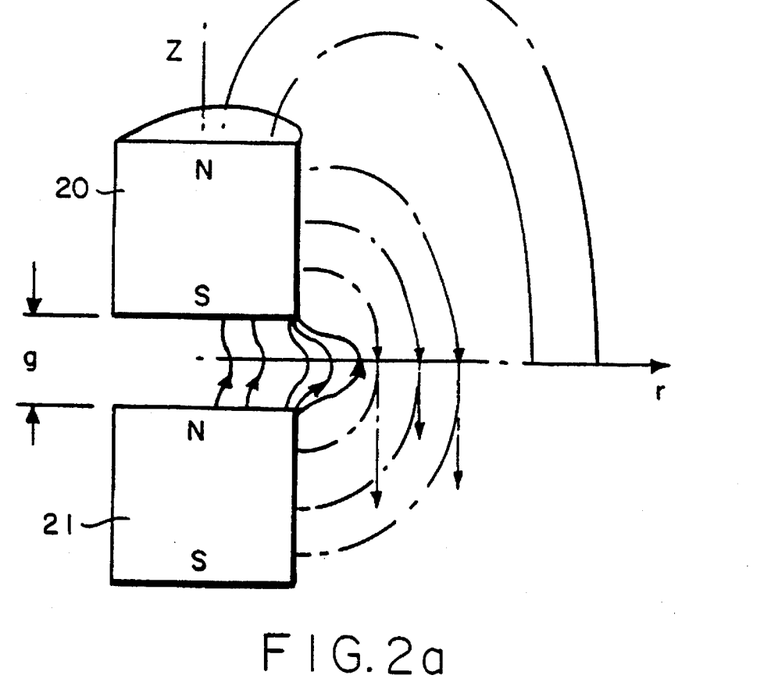
FIG. 2a is a front elevational view of $B_o$ magnet system for a MRI probe in accord with the present invention illustrating two cylindrical magnets spaced axially with a gap "g" and illustrating the magnetic field lines provided by these magnets.
Figure 2B:
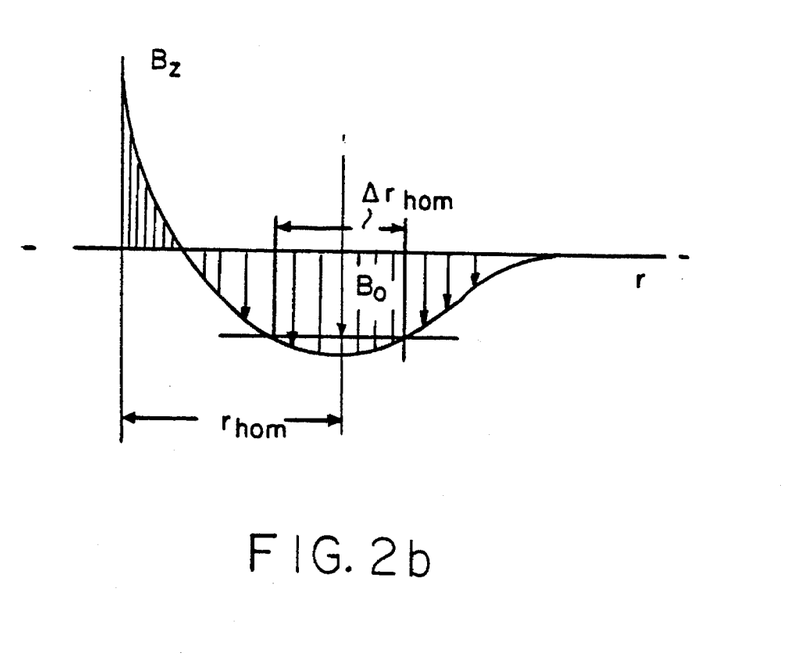
FIG. 2b is a graph illustrating a typical $B_z$ v. r relationship for a particular value of z in the target field region in the vicinity of the gap "g" for the primary magnet configuration in FIG. 2a and showing a radial region of substantial homogeneity of the $B_z$ field.

In a preferred embodiment, the primary or background magnetic field $B_o$ is provided by a primary magnet configuration consisting of two cylindrical permanent magnet blocks 20,21 aligned axially with the magnetic moment vector of each magnet oriented similarly and with an axial space or gap "g" between the two magnets (FIG. 2a). Pole end caps can also be used to increase homogeneity of the $B_o$ field in the target region. The field of the two magnets including the fringe field near the gap and the external return field is illustrated in FIG. 2a. The field strength $B_o$ versus radius in the direction out from the axis is illustrated in FIG. 2b. As can be seen, there is a radial region of substantial homogeneity $\Delta r_{hom}$ in the plane perpendicular to the axis and between the two magnets. The size of this region and the magnitude of $B_o$ in the region can be varied by physical parameters such as the strength and dimensions of the magnets 20,21 and the gap distance between the magnets. Although permanent magnet blocks are used in this embodiment, it will be recognized by those skilled in this art that electromagnets can also be used to provide the background field $B_o$.

Figure 3:
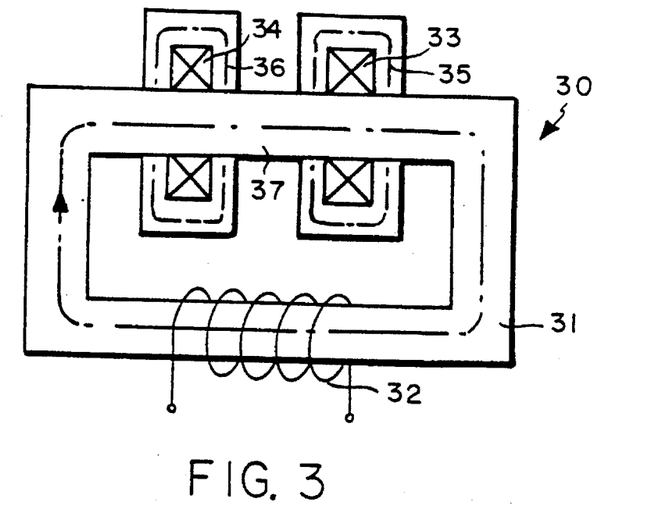
FIG. 3 is a schematic illustrating a configuration for magnetizing a permanent magnet with axially dependent magnetization strength.

A preferred magnetization device 30 for magnetizing permanent magnet blocks for use in accord with the present invention is illustrated in FIG. 3. The device 30 has a basic traditional magnetization core loop 31 with a primary excitation coil 32 and additional magnetization coils 33,34. Ferromagnetic ring cores 35,36 are provided around the additional magnetization coils 33,34 to provide axially variable additional magnetization flux in the permanent magnet at the position of these coils to generate an optimal axial magnetic dipole density distribution, thereby delivering better magnetic field homogeneity in the target zone. The permanent magnet block to be magnetized is positioned in the shaded region 37 within loop 31. The magnetization device illustrated in FIG. 3 is shown with two additional magnetization coils, which are used to vary the magnetic strength within the permanent magnet block to produce a shaped external magnetic field having the desired region of homogeneity. The device can use any number of such additional magnetization coils to optimize the spatial magnetization distribution of the permanent magnet.

Figure 5A:
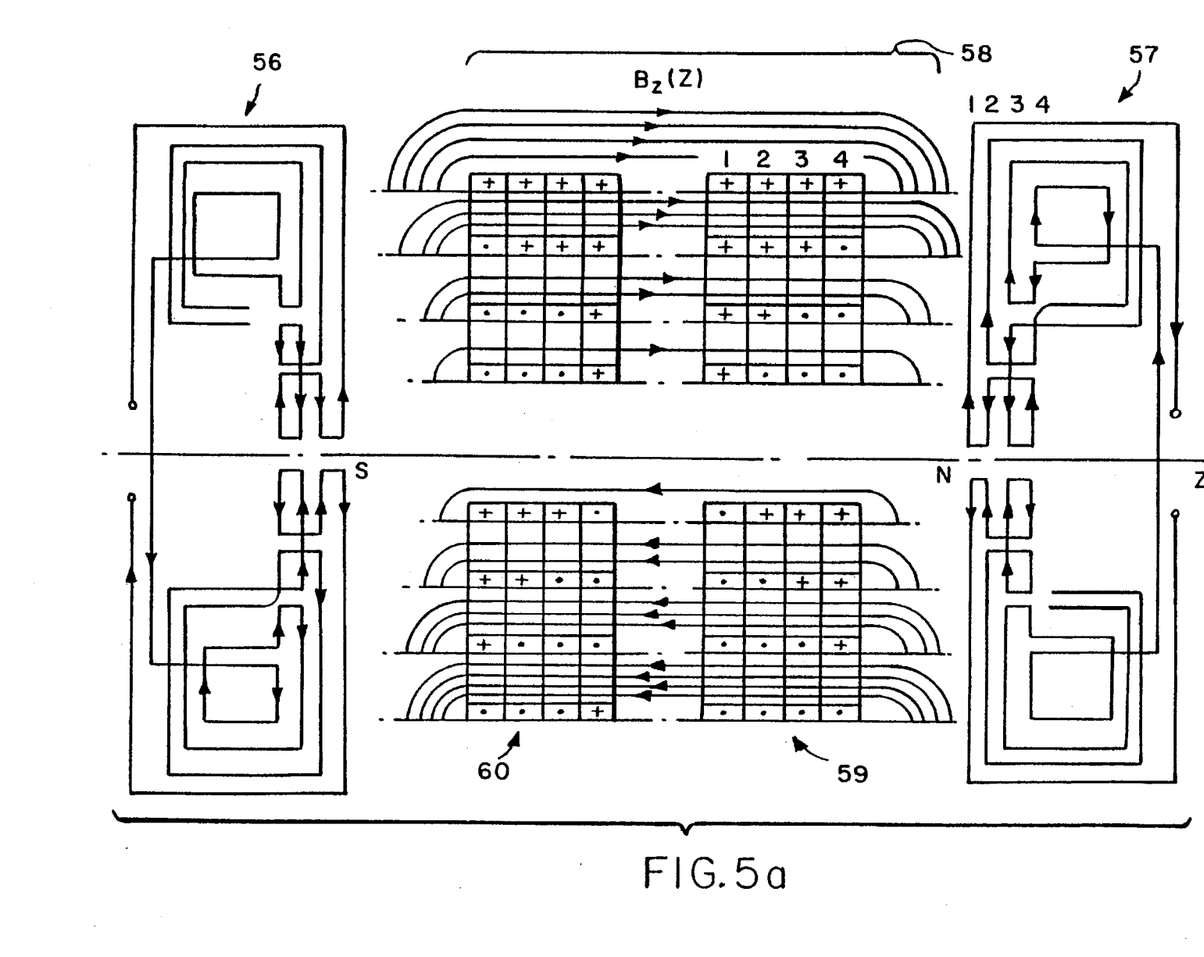
FIG. 5a illustrates schematically the wiring design on a cylindrical surface for an approximately linear angular ("ø") gradient coil configuration providing a $B_z$ field gradient that varies approximately linearly with ø along approximately 360 degrees of angular ø-coordinate in a cylindrical coordinate system and also provides a field that is substantially constant as a function of z (in the axial direction) in a target region between subcoils 56,57.
Figure 5B:
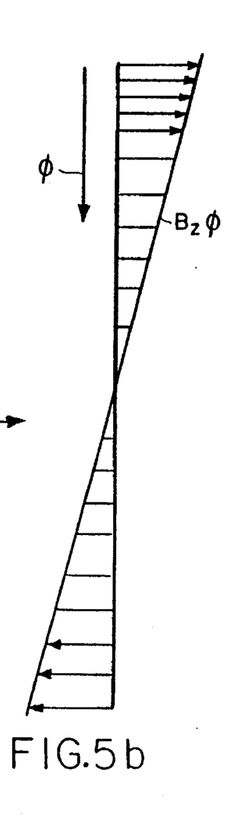

The present invention also provides a ø-gradient coil for use in generating image data in a cylindrical coordinate system. The ø-gradient coil provides a $B_z$ field that varies with ø and is substantially constant with z over a particular region of z between subcoils 56,57. FIG. 5a illustrates a wiring layout (and the resulting gradient field—FIG. 5b) for a ø-gradient coil that will provide a linear field gradient $B_z$ as a function of the angle "ø". The configuration is illustrated in FIG. 5a as a cylindrical surface envelope around the longitudinal axis "z" (i.e., the axis of cylindrical symmetry) and consists of two symmetrically distributed subcoils 56,57 positioned in a spaced relation along the z-axis. This configuration of ampere wire turns provides in the region between subcoils 56,57 both a linear gradient field $B_z$ that varies with ø and an approximately constant field in the z-direction. The gradient field $B_z$ provided by the subcoils varies over the full 360° of ø. Each subcoil 56,57 consists of multiple parallel surface current wires which vary in length and electric current direction with the angle ø to provide a gradient field in the z-direction that varies linearly with the angle ø. The subcoil configurations 56,57 have distributed angular length and polarity to generate an approximately constant angular gradient of z-field component $B_z$ for ø from about 0° to 360°, except for a small aliasing region around 0° (or 360°). The illustrated coil configuration 56,57 shows axial and angular current distribution providing electrical current flow in parallel wires having appropriate polarity at various angular positions as illustrated by wire sections 58 (FIG. 5a).

FIG. 5a illustrates in two different portions (56,57 and 59,60) how a single continuous electrical conductor can be configured to provide a variable net current as a function of 4For example, wire segments 58 show the polarities of two sets of four parallel wires 59,60 which correspond directly with the parallel wire segments in subcoils 56,57. In each segment of subcoils 56,57, the direction of the current is varied at different angular positions ø, which are shown to demonstrate a variable net current as a function of ø. To produce the spatial encoding $B_z$ field for MRI, the current must be directed circumferentially as illustrated in FIG. 5a. The layout of each subcoil 56,57 shows current both circumferentially and axially of a single continuous conductor to produce the circumferential current variation with ø shown in the wire sections 58.

Thus, the strength of the resulting $B_z$ field at any angular position is the sum of the individual field portions provided by the parallel wire segments at that angular position. Subcoils 56 and 57 are mirror images, spaced axially to provide a substantially homogeneous field along z between the subcoils. The resulting field is also illustrated quantitatively in FIG. 5b which shows an approximately linear with ø-angular field density distribution. The lengths of parallel portions of wire having polarity as illustrated in the wire segments 58 and their current direction can be adjusted to provide various field density distributions varying with ø.

Figure 5C:
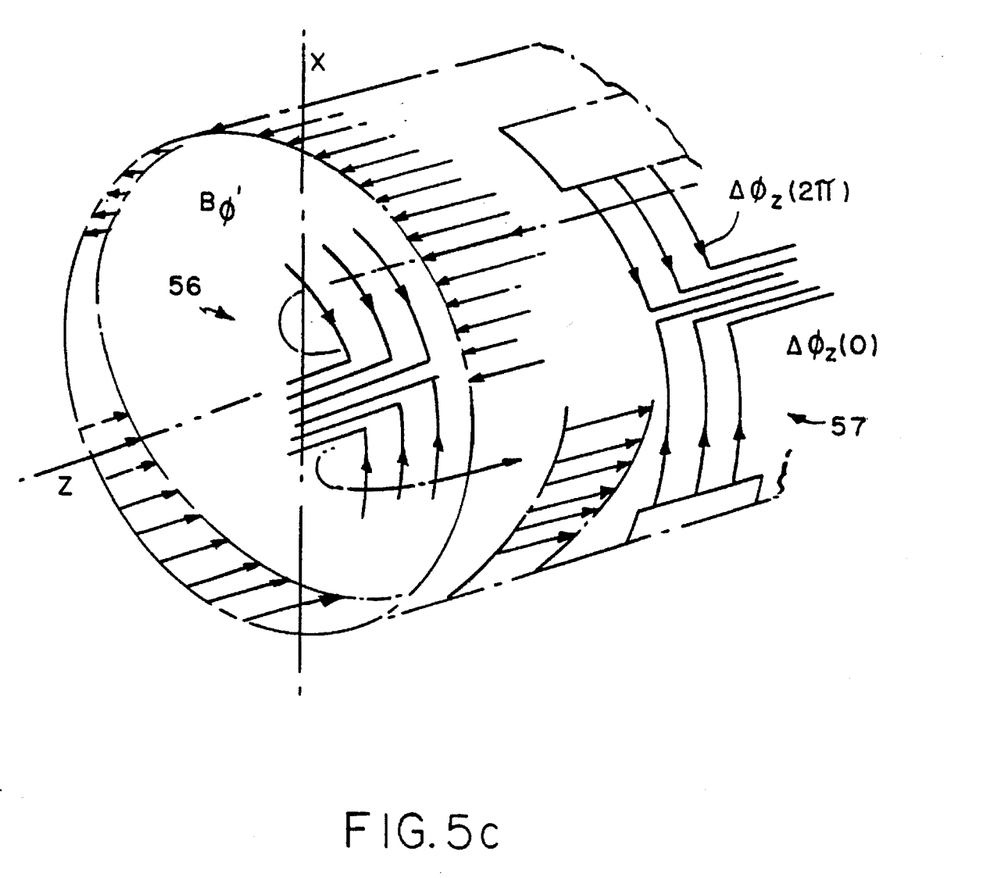
FIG. 5c illustrates in three dimensions a gradient coil configuration and the ø dependent $B_z$ field it produces.
Figure 5D:
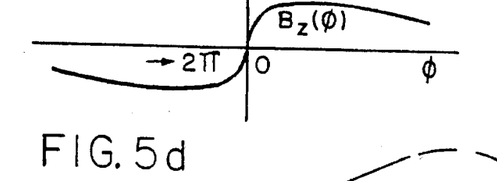
Figure 5E:
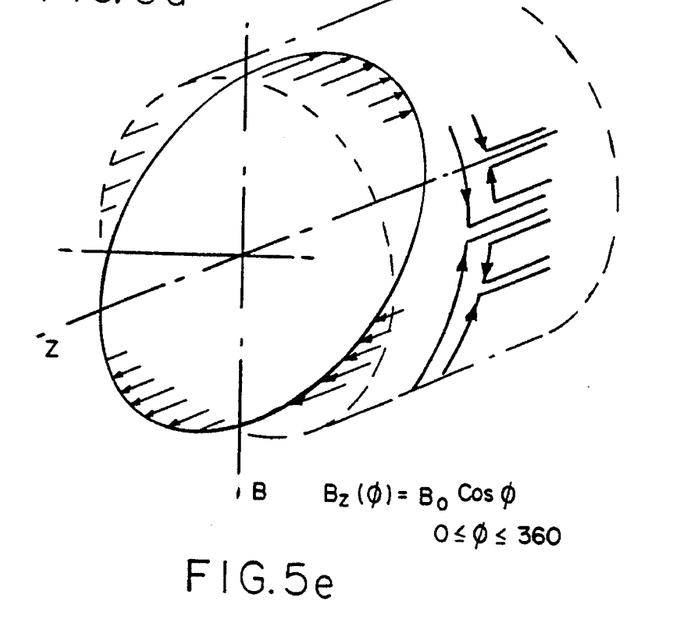
FIG. 5e illustrates an alternative angular gradient coil, the $B_z$ field of which varies sinusoidally with ø and shows one sinusoidal period for 360 degrees of angular ø- coordinate.
Figure 5F:
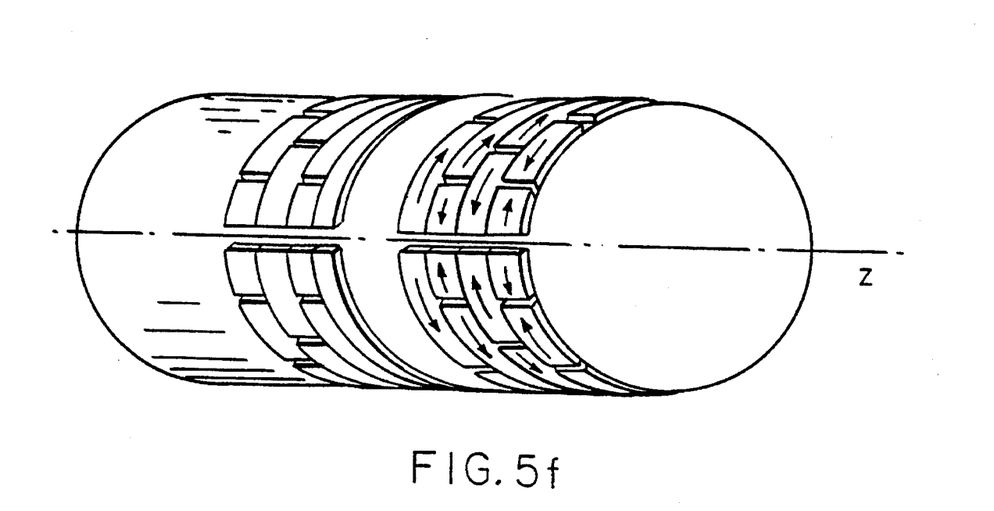
FIG. 5f illustrates in a three dimensional mode an ampere wire configuration for an angular gradient coil showing the direction of current in parallel conductors around the surface of a cylinder to provide the ø-gradient field.

FIG. 5c is provided to aid in the understanding of the angular gradient coil configuration by illustrating the angular gradient field in cylindrical form, which corresponds to the planar illustration in FIG. 5a. The illustration in FIG. 5d is provided specifically to demonstrate qualitatively the angular region ø where the field returns from a minimum peak to a maximum peak for the coil of FIG. 5a. This angular region is aliased in the image and is minimized in the coil design. Alternatively, a full sinusoidal period in 0° to 360° of the ø-gradient coil as illustrated in FIG. 5e can be used for spatial encoding in the angular dimension. This can be accomplished by appropriate distribution of wire lengths and polarities using a coil similar to the coil shown in FIG. 5a. FIG. 5f illustrates a three dimensional surface view of such ampere wire configuration with the arrows showing current direction in various conductor segments.

Figure 6A:
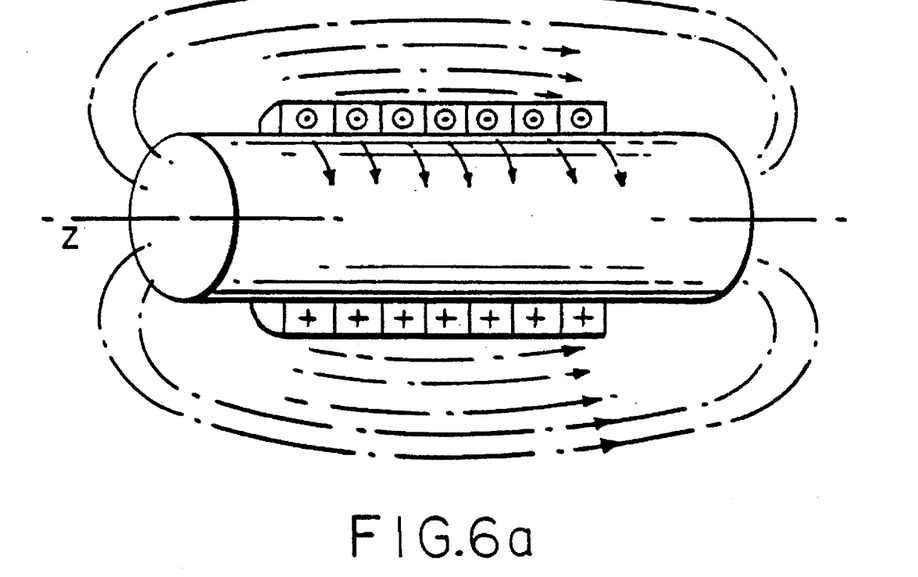
FIG. 6a is an illustration of a solenoidal type of r-gradient coil and the resulting field contours (lines of force) generated by such gradient coil.
Figure 6B:
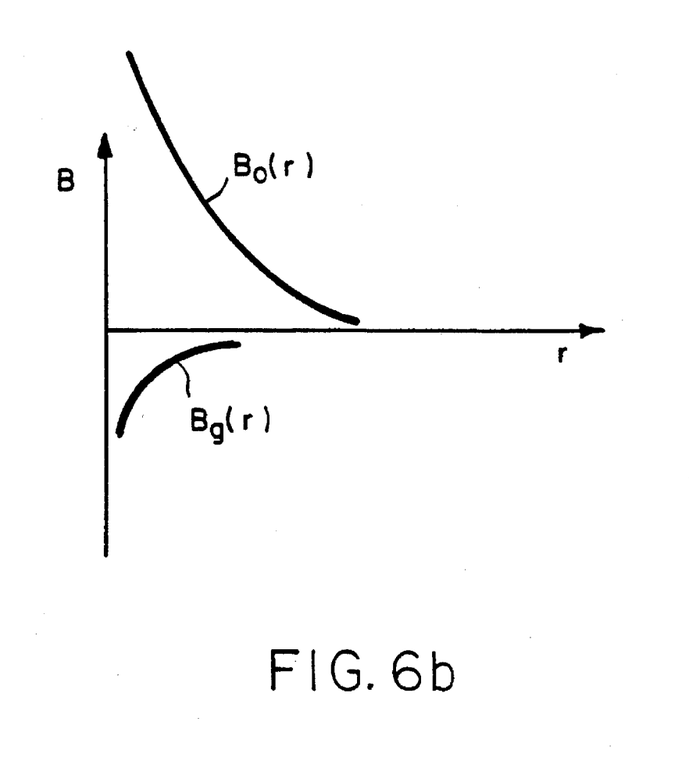
FIG. 6b is a graph illustrating the superposition of the radial field component of the background (main) magnet and the field of the r-gradient coil.

The design and configuration of a r-gradient or radial gradient coil is illustrated in FIG. 6a. The illustrated r-gradient coil provides a z-direction field ($B_z$) that varies inversely with the radius and is a solenoidal coil having specific wire turn density distribution to provide a z-field in the imaging volume that varies approximately linearly over small regions of the radius, generally in close proximity to the cylindrical magnet surface. The radial gradient coil provides a z-field which is superposed with the inherent background field $B_o$, which also varies with r, to provide a total approximately linear r-gradient field for spatial r encoding in a given region—the imaging volume. The background field variation in the radial direction $B_o(r)$ and corresponding radial gradient field $B_g(r)$ are illustrated in FIG. 6b. It can be seen that the r-gradient coil or a similar coil can also be used as a shimming coil to optimize the background field strength variation in the radial direction.

For spatial encoding in the axial direction, a z-gradient coil is used. The conventional Helmholtz pair of coils is suited for providing a z-gradient field in a region external to the primary magnet. The construction and use of such coils is well known to those skilled in the art.

Alternatively, a polypole coil can be used, e.g., for a r-, ø-gradient coil. The construction and use of such polypole coils is described in U.S. Pat. No. 5,365,172, the disclosure of which is hereby incorporated by reference. The ø-gradient coil can be constructed as illustrated in FIG. 5e to provide a polypole coil having ø and r dependence for use in accord with the techniques discussed in U.S. Pat. No. 5,365,172. Because the z and ø gradient coils described above produce a field which also has dependence on the radius, it may be preferred to use a polypole coil for imaging.

Figure 7A:
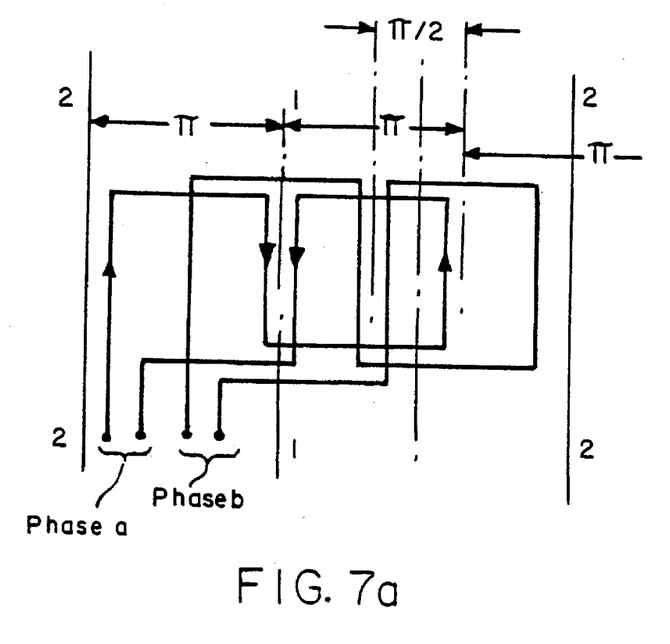
FIG. 7a is a schematic illustrating wiring around a cylindrical surface (flattened out in planar form) for a quadrature—two phase—rf coil.

The rf coil used in connection with a magnet probe of the present invention is preferably a traditional quadrature (two phase) coil as illustrated in FIG. 7a which shows a wiring layout envelope for each half ("π") of the cylindrical surface. The construction and use of such coils is well known to those skilled in the art. These coils provide a circularly polarized (synchronous rotation) magnetic field that is orthogonal at each angular position to the z-oriented background field $B_o$ and that is appropriate for generating precession of magnetic spins in the sample. Preferably, the rf coil is located on a ferromagnetic (e.g., iron or ferrite) surface so that a portion of the flux path is shunted by relatively high μ core material to increase coil efficiency and require less excitation current. This can be accomplished by placing the rf coil directly on the surface of the permanent magnet block of the probe. Such a configuration is particularly useful for MRI probes in accord with this invention. This rf coil can be used for both excitation of nuclear spins of nuclei in the target region and for receiving NMR signals.

Figure 7B:
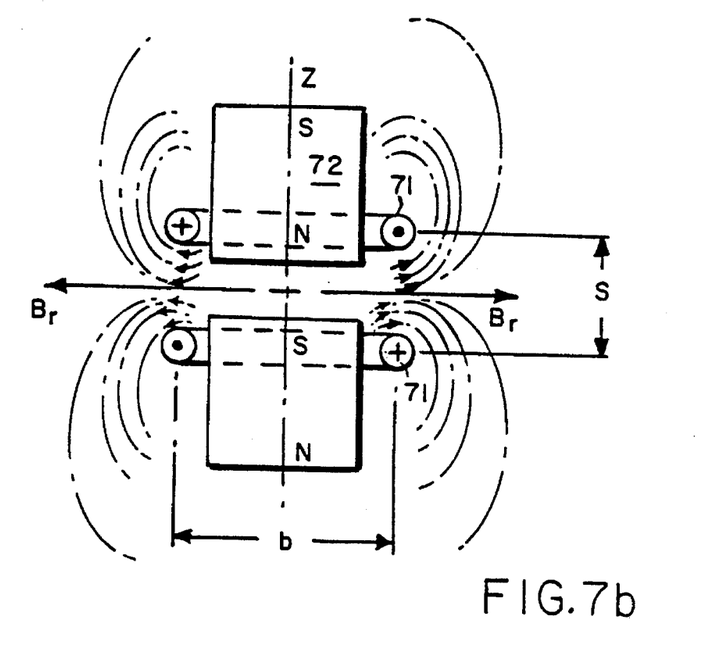
FIG. 7b is a schematic illustrating an alternative rf coil configuration consisting of a Helmholtz pair to generate an rf field that is radially oriented and orthogonal to the background axial $B_o$ field generated by the primary magnet.

Alternatively, excitation can be provided by a rf coil system in the form of a Helmholtz pair of coils as illustrated in FIG. 7b. This produces a linearly polarized radially directed rf field in the annular target region that is orthogonal to the primary magnet background field $B_o$.

Figure 8A:
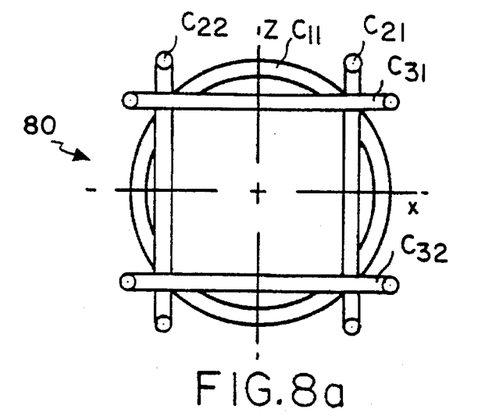
FIGS. 8a–8c illustrate an alternative tri-axial orthogonal rf coil set for use external to a sample or patient in which a MRI probe is used.
Figure 8B:
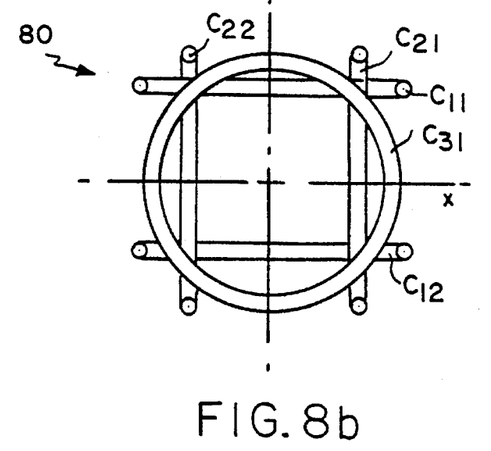
Figure 8C:
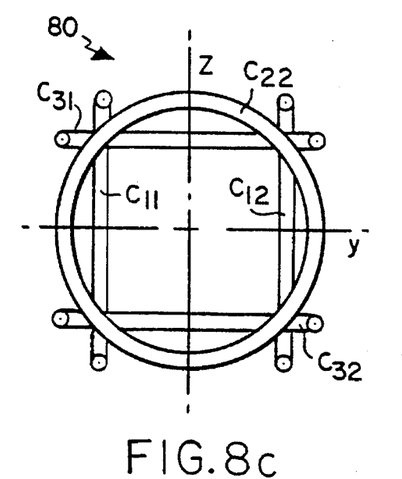

In another embodiment, excitation also can be provided by a rf coil system 80 as illustrated in FIGS. 8a–8c, which can be located externally of the sample—i.e, not integral with the probe. Conveniently, such rf coil system 80 consists of three pairs of mutually orthogonal circular coils ($C_{11}$, $C_{12}$; $C_{21}$, $C_{22}$; and $C_{31}$, $C_{32}$) to provide a circularly polarized field vector in which the axis of rotation can be oriented in any direction by feeding the coil pairs with appropriately modulated periodic currents to control the field vector. This ability to orient in any direction is necessary because the $B_o$ field direction changes with the orientation of the probe in the sample. This rf coil system can also be used to receive NMR signals.

Figure 9:
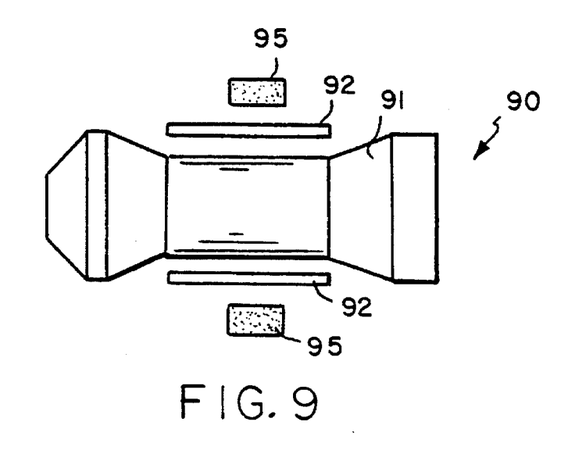
FIG. 9 is a schematic illustrating a MRI probe in accord with the present invention and the location of a homogeneous field region from which NMR signals are collected for image reconstruction.

In one embodiment of a MRI probe for vascular applications for imaging wall tissue in accord with the present invention, the MRI probe 90 including the permanent magnet 91 and the coils 92 preferably have diameter of about 2 mm (FIG. 9). The imaging volume or target field region 795 having a substantially homogeneous background field $B_o$ that is about 0.25 mm in the radial direction and about 0.5 mm in the axial direction. However, the size of the MRI probe will be determined by the particular application, e.g., for enclosure in a catheter tip that can be conveniently inserted into the passage or cavity to be imaged. Preferred MRI probes have a diameter in the range of from about 1 mm to about 1 cm. The catheter is made of conventional pharmacologically acceptable materials as is well known in the art.

Figure 10:
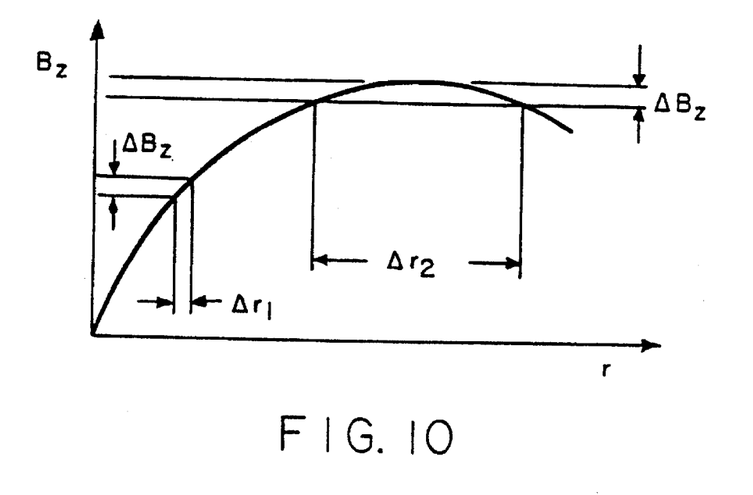
FIG. 10 is a graph (similar to FIG. 2b) illustrating $B_z$ versus r in a region where the field is going through an extremum to illustrate a slice selection imaging technique in a cylindrical coordinate system.

Images can be made with the MRI probe of the present invention using imaging techniques known to those skilled in the art. For example, in accord with a conventional technique to select a slice for MR imaging, a selective rf pulse, which is a bandwidth limited (in frequency) pulse, is used to excite nuclei with a Larmor precession within the bandwidth of the pulse. Typically, a linear magnetic field gradient is provided so that the Larmor frequency varies linearly with the position in the direction of the gradient. The Larmor frequency "$\upsilon$" can be represented as $\upsilon=\gamma B$ where $\gamma$ is a constant for the particular nuclear species and is called the gyromagnetic ratio. Thus, after application of a selective rf pulse in the presence of the linear gradient, a planar slab in the target region is excited. When using the MRI probe of the present invention having cylindrical symmetry of the $B_o$ field surrounding the probe, such selective excitation results in an annulus having finite dimension in the radial and axial directions being excited. The particular dimensions of r and z are determined by the homogeneity of the background $B_o$ field. For example, considering a graph of $B_z$ versus r, as illustrated in FIG. 10 (which is similar to FIG. 2b), in a region where the field is not going through an extremum, the field changes rapidly with r and hence the $\Delta r_1$ corresponding to a particular field change $\Delta B_z$ or corresponding to a change in Larmor frequency $\Delta \upsilon$ is small. Near the extremum in the curve $B_z$ vs. r, a larger region in r is excited for the same bandwidth pulse. It is preferred to excite the nuclei in a r region corresponding to $\Delta r_2$ where the $B_z$ field goes through an extremum, thereby exciting the largest possible region $\Delta r$.

After an annular ring of material is selected or excited, a polypole field, also called a PERL field is applied, as is described in U.S. Pat. No. 5,365,172. As previously described, the PERL field can be expressed as $B_z=Ax \cos(kz)$, where A and k are constants and x and z are orthogonal rectilinear coordinates. The field is periodic in z and linear in x. For cylindrical symmetry and the r- and ø-gradient coils as described in a preferred embodiment of the present invention, the PERL field can be expressed as $B_z=A/r \cos(kø)$ and the field is periodic in ø and linear in r over defined regions of r. Thus, although the $B_z$ field gradient is inversely proportional to r and not strictly linear on a large scale, within a small region surrounding r=r', within which imaging is performed, A/r can be approximated by the expression $A/r \approx A/r' - (r-r')A/r'$, which is linear. Hence, after exciting the nuclei within an annular ring, an image of the ring is resolved in r and z and is obtained by acquiring the NMR signal in the presence of the PERL field.

To change the z position of the excited annular ring, the MRI probe is physically moved in the axial direction, e.g., by moving the catheter in which the probe is encapsulated along an artery or passageway. To image a different annular ring centered about a different value of r, the value r' where the extremum is located is changed. This can be accomplished by providing a cylindrical solenoidal coil around the primary magnet similar to that illustrated in FIG. 6a. The solenoidal coil is excited to create a field component in the region of interest, the field decaying inversely with r. By adding or subtracting this field to the $B_o$ field produced by the primary magnet, the position of the extremum can be moved along the radius.

The MRI probes of the present invention can also be used for NMR spectroscopy. The invention has been described in detail with reference to preferred embodiments thereof. However, it will be appreciated that, upon consideration of the present specification and drawings, those skilled in the art may make modifications and improvements within the spirit and scope of this invention as defined by the claims. For example, where permanent magnets are described for the primary magnets, it is well known to substitute electromagnets to obtain the same or similar magnetic fields.

We claim:

1. A magnetic resonance imaging (MRI) probe having an external background magnetic field $B_o$, said probe comprising:

a primary magnet having a longitudinal axis and an external surface extending in the axial direction, and a rf coil surrounding and proximal to said surface, wherein the $B_o$ field provides an imaging volume having a region of substantial homogeneity of axial directed field component along said surface and proximal to said surface.

2. The MRI probe of claim 1 wherein said primary magnet is a permanent magnet.

3. The MRI probe of claim 1 wherein said primary magnet has soft ferromagnetic end caps.

4. The MRI probe of claim 2 wherein said primary magnet has soft ferromagnetic end caps.

5. The MRI probe of claim 1 wherein said $B_o$ field is provided by two magnets spaced axially and in axial alignment, the magnetic moment vector of each magnet being oriented in the same direction.

6. The MRI probe of claim 1 wherein said primary magnet is a cylindrical permanent magnet and surrounding said primary magnet are r-, z- and ø-gradient coils.

7. The MRI probe of claim 1 wherein said rf receiver coil also provides an excitation pulse to excite nuclei in an imaging region.

8. The MRI probe of claim 1 wherein said rf coil comprises a quadrature (two phase) coil to produce a circularly polarized, synchronous rotation excitation field orthogonal at each angular position to the z-oriented $B_o$ field.

9. An angular gradient coil for use in magnetic resonance imaging in a cylindrical coordinate system having axial (z-), radial (r-) and angular (ø-) coordinates, said coil comprising two mirror image subcoils on a cylindrical surface, the subcoils being spaced in the z-direction, each subcoil having a plurality of parallel segments of electrical conductors, the length and direction of current in each segment being arranged and constructed to provide a magnetic field $B_z$ component in the direction that varies with angular position ø in a periodic manner over a selected range of angular position and is constant over z between the mirror image subcoils.

10. A magnetic resonance imaging (MRI) probe having an external background magnetic field $B_o$, said probe comprising:

a primary magnet having a longitudinal axis and an external surface extending in the axial direction, and surrounding said primary magnet are r-, z- and ø-gradient coils;

wherein the $B_o$ field provides an imaging volume having a region of substantial homogeneity of axial directed field component along said surface and proximal to said surface.

11. The MRI probe of claim 10 further comprising a rf coil surrounding and proximal to said surface.

12. The MRI probe of claim 10 wherein said primary magnet is a cylindrical permanent magnet and a rf coil surrounds and is proximal to said surface.

* * * * *